United States Patent
Basceri et al.

(10) Patent No.: US 6,586,285 B1
(45) Date of Patent: Jul. 1, 2003

(54) PLASMA ENHANCED CHEMICAL VAPOR DEPOSITION METHOD OF FORMING TITANIUM SILICIDE COMPRISING LAYERS

(75) Inventors: Cem Basceri, Boise, ID (US); Irina Vasilyeva, Boise, ID (US); Ammar Derraa, Boise, ID (US); Philip H. Campbell, Meridian, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/094,017

(22) Filed: Mar. 6, 2002

(51) Int. Cl.$^7$ ............................................ H01L 21/84
(52) U.S. Cl. ............................................... 438/151
(58) Field of Search ....................... 438/151, 152–166, 438/585, 584

(56) References Cited

U.S. PATENT DOCUMENTS

| | | | |
|---|---|---|---|
| 4,957,777 A | * 9/1990 | Ilderem et al. ............ | 438/677 |
| 5,240,739 A | 8/1993 | Doan et al. ............... | 427/126.1 |
| 5,252,518 A | 10/1993 | Sandhu et al. ............ | 437/200 |
| 5,278,100 A | 1/1994 | Doan et al. ............... | 437/200 |
| 5,344,792 A | 9/1994 | Sandhu et al. ............ | 437/200 |
| 5,376,405 A | 12/1994 | Doan et al. ............... | 427/126.1 |
| 5,976,976 A | 11/1999 | Doan et al. ............... | 438/683 |

OTHER PUBLICATIONS

U.S. patent application Ser. No. 09/944,903, Derraa et al., filed Aug. 30, 2001.
U.S. patent application Ser. No. 09/945,065, Derraa et al., filed Aug. 30, 2001.

* cited by examiner

*Primary Examiner*—Craig Thompson
(74) *Attorney, Agent, or Firm*—Wells St. John P.S.

(57) ABSTRACT

A first cleaning is conducted on a plasma enhanced chemical vapor deposition chamber at room ambient pressure. After the first cleaning, elemental titanium comprising layers are chemical vapor deposited on a first plurality of substrates within the chamber using at least $TiCl_4$. Thereafter, titanium silicide comprising layers are plasma enhanced chemical vapor deposited on a second plurality of substrates within the chamber using at least $TiCl_4$ and a silane. Thereafter, a second cleaning is conducted on the chamber at ambient room pressure. In one implementation after the first cleaning, an elemental titanium comprising layer is chemical vapor deposited over internal surfaces of the chamber while no semiconductor substrate is received within the chamber. In another implementation, a titanium silicide comprising layer is chemical vapor deposited over internal surfaces of the chamber while no semiconductor substrate is received within the chamber.

17 Claims, No Drawings

PLASMA ENHANCED CHEMICAL VAPOR DEPOSITION METHOD OF FORMING TITANIUM SILICIDE COMPRISING LAYERS

TECHNICAL FIELD

This invention relates to plasma enhanced chemical vapor deposition methods of forming titanium silicide comprising layers.

BACKGROUND OF THE INVENTION

Conductively doped silicon regions are conventionally utilized as source/drain regions of field effect transistors and as other node locations in integrated circuitry. In fabricating integrated circuitry having such regions, insulative layers are typically fabricated over the regions and contact openings are formed therethrough to the regions. Conductive material is ultimately received within the openings and makes electrical connection with the conductively doped source/drain or other regions. Exemplary conductive materials include conductively doped polysilicon and other semiconductive materials, metals, and metal compounds.

Refractory metal silicides, such as titanium silicide, have been utilized as part of the conductive material, typically as an interface region between the conductively doped silicon region and other overlying conductive material. One prior art method of forming the titanium silicide is to deposit elemental titanium and thereafter heat the substrate to cause a reaction of the deposited titanium with underlying silicon to form the silicide. Alternately, deposition conditions can be selected such that the depositing titanium reacts with the silicon from the substrate during deposition to form the silicide. In either instance, silicon is consumed from the underlying substrate diffusion junction region in forming the silicide.

In certain applications, particularly in light of the ever-increasing density of circuitry being fabricated, it is highly undesirable for a significant quantity of the underlying silicon of the junction to be consumed. Accordingly, methods have been developed which prevent, or at least reduce, underlying silicon consumption by providing a silicon source other than or in addition to the silicon of the substrate for forming the silicide. One prior art method is to plasma enhance, chemically vapor deposit the silicide by combining a silane gas and $TiCl_4$ under suitable reaction conditions to form titanium silicide which deposits over the junction region with minimal if any consumption of substrate silicon. Unfortunately, the wafer surface has been found on occasion to become contaminated with particles in processes utilizing $TiCl_4$ and a silane as compared to primarily forming the silicide by reacting titanium with silicon of the substrate.

It was surmised that the particles which were undesirably forming on the wafers might be occurring during either or both of the actual titanium silicide deposition or after the deposition when the wafers were being moved into and out of the reactor chamber. While unclear, it was theorized that the particle formation might be occurring from silane and/or chlorine constituents adhering to the chamber sidewalls perhaps as a result of the deposition, or that chlorine was somehow undesirably being added to the chamber walls during a chamber cleaning which uses chlorine intermediate each wafer deposition.

For example, one exemplary prior art processing intending to reduce particle count employs a $Cl_2$ clean between titanium silicide depositions on separate wafers. For example, after a silicide deposition on one wafer within a reactor chamber, the wafer is removed from the chamber. Then, an argon flow of 500 sccm as a purge gas is flowed through the chamber. This is followed by a $Cl_2$ flow of 2,000 sccm for two seconds as a stabilizing step, with the $Cl_2$ flow then being continued at 2,000 sccm for an additional 15 seconds. The intended effect of the $Cl_2$ clean is to remove titanium material which might undesirably adhere to the internal surfaces of the chamber during the titanium silicide deposition. Upon completion of the $Cl_2$ cleaning step, an 8,000 sccm argon purge feeding is conducted to remove the chlorine. This is followed by a flow of Ar at 8,000 sccm in combination with 1,000 sccm of He. He is lighter than Ar, and can facilitate chamber purging and cleaning, and also facilitates temperature control within the chamber. Subsequently, another wafer is provided within the chamber, and titanium silicide deposition is conducted.

The above-described cleaning process is typically conducted between each single wafer deposition, and typically in the absence of plasma. Yet every 10 to 20 wafer depositions, the chamber is also typically subjected to a plasma clean with $Cl_2$ to better clean/remove titanium from the chamber walls. Further, every 5,000 or so wafer depositions, the whole system is subjected to an atmospheric/room ambient pressure wet clean and scrub (i.e., using $NH_4OH$ $H_2O_2$ and isopropyl alcohol in various steps) whereby the whole system is cleaned out. The other above-described cleanings are typically conducted with the reactor chamber essentially at the deposition pressure and temperature conditions.

The invention was principally motivated towards overcoming the above-described surface defect issues, but is in no way so limited. The invention is only limited by the accompanying claims as literally worded without limiting or interpretative reference to the specification, and in accordance with the doctrine of equivalents.

SUMMARY

The invention includes plasma enhanced chemical vapor deposition methods of forming titanium silicide comprising layers. In one implementation, a first wet cleaning is conducted on a plasma enhanced chemical vapor deposition chamber at room ambient pressure. After the first wet cleaning, elemental titanium comprising layers are chemical vapor deposited on a first plurality of substrates within the chamber using at least $TiCl_4$. After depositing elemental titanium comprising layers over the first plurality of substrates, titanium silicide comprising layers are plasma enhanced chemical vapor deposited on a second plurality of substrates within the chamber using at least $TiCl_4$ and a silane. After depositing the titanium silicide comprising layers on the second plurality of substrates, a second wet cleaning is conducted on the chamber at ambient room pressure.

In one implementation after the first wet cleaning, an elemental titanium comprising layer is chemical vapor deposited over internal surfaces of the chamber while no semiconductor substrate is received within the chamber. In one implementation after the first wet cleaning, a titanium silicide comprising layer is chemical vapor deposited over internal surfaces of the chamber while no semiconductor substrate is received within the chamber.

DETAILED DESCRIPTION OF THE PREFERRED EMBODIMENTS

This disclosure of the invention is submitted in furtherance of the constitutional purposes of the U.S. Patent Laws "to promote the progress of science and useful arts"(Article 1, Section 8).

The invention encompasses plasma enhanced chemical vapor deposition methods of forming titanium silicide comprising layers over a plurality of substrates, such as semiconductor substrates. The description below and concluding claims include references to first, second, etc. substrates, cleanings, etc. Such only indicate sequence with respect to the respective acts or nouns which they qualify, and in no way preclude other processing occurring intermediate any of the stated processings, nor do they preclude processing prior to the first stated processing nor after the last stated processing, unless otherwise indicated.

In accordance with an aspect of the invention, a first cleaning is conducted in a plasma enhanced chemical vapor deposition chamber at room ambient pressure. Typically, such a cleaning would be conducted after a previous series of depositions upon semiconductor substrates within the chamber. By way of example only, an exemplary cleaning includes providing the reactor chamber at atmospheric pressure and internal components at below 100° C. Certain components, such as the lid, are cleaned with an aqueous solution of $NH_4OH$ and $H_2O_2$. Other portions of the chamber are cleaned with a 30% by volume $H_2O_2$ solution, followed by a deionized water cleaning, and then cleaning with isopropyl alcohol. The invention was reduced-to-practice in the context of utilizing a Centura Model #2658, available from Applied Materials of Santa Clara, Calif., having an internal volume of 6.55 liters. However, any reactor and any first cleaning, whether wet or dry, and whether existing or yet-to-be-developed, are contemplated.

In one implementation after the first cleaning, elemental titanium comprising layers are chemical vapor deposited on a first plurality of substrates within the chamber using at least $TiCl_4$. This preferably occurs without any substrate depositions occurring between the first cleaning and starting with the elemental titanium comprising layer depositing. Such depositions can be conducted with or without plasma, with plasma deposition being preferred. Further, the layers can be deposited to consist essentially of elemental titanium. By way of example only and in the above reactor chamber, exemplary deposition conditions include a substrate temperature of from 600° C. to 700° C., pressure within the chamber at from 3 Torr to 6 Torr and applied power of from 200 watts to 600 watts. Preferred gas flows include $TiCl_4$ at from 50 sccm to 150 sccm, argon flow at from 2,000 sccm to 6,000 sccm, He at from 1,000 sccm to 2,000 sccm and hydrogen flow at from 2,000 sccm to 10,000 sccm.

Preferably, the first plurality constitutes at least 20 substrates, preferably semiconductor substrates, yet is also preferably no greater than 200 substrates. In one preferred embodiment, the plurality is no greater than 100 substrates, and in another preferred embodiment is no greater than 50 substrates. A preferred effect in such processing is to reduce surface particle count, as will be further described below. Reduction-to-practice occurred in a single wafer plasma enhanced chemical vapor deposition reactor and in depositing a single elemental titanium comprising layer separately on the respective substrates, although the invention is not so limited.

After depositing elemental titanium comprising layers over the first plurality of substrates, titanium silicide comprising layers are plasma enhanced chemical vapor deposited on a second plurality of substrates within the chamber using at least $TiCl_4$ and a silane. One or more silanes might be utilized, with an exemplary preferred silane being $SiH_4$. Silanes including more than one silicon atom, as well as organic silanes, are also of course contemplated. Preferred processing for the above-described titanium silicide deposition is as described above with respect to the elemental titanium comprising layer deposition, but with the addition of an exemplary flow of $SiH_4$ at 0.5 sccm to 10 sccm. Plasma generation can be direct within the chamber, and/or remote from the chamber.

Preferably, the number in the second plurality of substrates will be greater than the first, for example by a factor of at least 5 in one embodiment, and more preferably by at least 10. A preferred intent is that the first plurality processing be sufficient in number to reduce the undesired surface particle count in a first-in-time deposited subset of the second plurality of substrates than would otherwise occur under identical processing conditions but without the chemical vapor depositing of elemental titanium on the first plurality of substrates. It was discovered that the adverse, undesired surface particle count that was occurring in the prior processing typically would cease after titanium silicide depositions of a certain number, for example at a greater than 200 semiconductor wafer processings in a single wafer chamber. In accordance with the above-described preferred aspect of the invention, it was discovered that the undesired surface particle count could be reduced significantly by depositing elemental titanium comprising layers, and preferably layers that consist essentially of elemental titanium, over some first plurality of substrates prior to starting titanium silicide layer depositions. Although not fully understood, it is theorized that some form of seasoning effect occurs within the chamber which reduces the quantity of adhering adverse material within the chamber (meaning that which was previously producing the high volume of surface particles) when such elemental titanium comprising layers deposition is first conducted. In certain instances, satisfactory results were achieved after elemental titanium layer depositions over only 20 substrates. In other instances, reduction in undesired surface particle count was not achieved until at least 50, 100 or some number between 100 and 200 substrates were processed by an elemental titanium comprising layer deposition on a first plurality of substrates.

After depositing the titanium silicide comprising layers on the second plurality of substrates, another cleaning, herein referred to for convenience as a second cleaning, is conducted on the chamber at ambient room pressure. Such might be the same or different from the above-described first ambient room pressure cleaning. Typically and most preferably, the chamber will be provided at subatmospheric pressure after the first stated cleaning for deposition of the elemental titanium and titanium silicide comprising layers. In accordance with a most preferred aspect, the chamber will not be exposed to room ambient pressure after being provided at such sub-atmospheric pressure until some time after depositing the titanium silicide layers on the second plurality of substrates, and is then exposed to such ambient room pressure preparatory to conducting the second cleaning.

The chamber can also of course be subjected to cleanings intermediate the single wafer cleanings, and/or intermediate some group of single wafer cleanings.

In another implementation, a first cleaning of a plasma enhanced chemical vapor deposition chamber is conducted at room ambient pressure, for example as described above. After such cleaning, an elemental titanium comprising layer and/or a titanium silicide comprising layer is/are deposited over the internal surfaces of the chamber while no semiconductor substrate is received within the chamber. An exemplary preferred thickness range for such a layer or layers is from 100 Angstroms to 1,000 Angstroms.

After depositing the elemental titanium comprising layer and/or titanium silicide comprising layer over the internal surfaces of the chamber while no semiconductor substrate is received therein, titanium silicide comprising layers are plasma enhanced chemical vapor deposited on a plurality of semiconductor substrates within the chamber using at least TiCl$_4$ and a silane, for example as described above. Then, at some point, the chamber is subjected to a second cleaning at ambient room pressure.

In a most preferred embodiment, elemental titanium depositing or titanium suicide layer depositing over such internal surfaces, in the absence of a semiconductor substrate within the chamber, is effective to reduce undesired surface particle counts in a first-in-time deposited subset of the plurality of semiconductor substrates than would otherwise occur under identical processing conditions but without said elemental titanium depositing over the internal surfaces of the chamber. It is theorized that such chamber surfacing depositing(s) has a seasoning effect to the reactor which reduces undesired surface particle counts, particularly in a first set of wafers which are deposited using TiCl$_4$ and a silane.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A plasma enhanced chemical vapor deposition method of forming titanium silicide comprising layers over a plurality of substrates, comprising:

first cleaning a plasma enhanced chemical vapor deposition chamber at room ambient pressure;

after the first cleaning, chemical vapor depositing elemental titanium comprising layers on a first plurality of substrates within the chamber using at least TiCl$_4$;

after depositing elemental titanium comprising layers over the first plurality of substrates, plasma enhanced chemical vapor depositing titanium silicide comprising layers on a second plurality of substrates within the chamber using least TiCl$_4$ and a silane; and after depositing the titanium silicide comprising layers on the second plurality of substrates, second cleaning the chamber at ambient room pressure.

2. The method of claim 1 wherein the chemical vapor depositing of the elemental titanium comprising layers occurs without any substrate depositions occurring between the first cleaning and starting of said elemental titanium comprising layer depositing.

3. The method of claim 1 wherein the chemical vapor depositing of the elemental titanium comprising layers is conducted with plasma generation.

4. The method of claim 1 wherein the first plurality is at least 20 substrates.

5. The method of claim 1 wherein the first plurality is from 100 substrates to 200 substrates.

6. The method of claim 1 wherein the first plurality from 20 substrates to 100 substrates.

7. The method of claim 1 wherein the first plurality is from 20 substrates to 50 substrates.

8. The method of claim 1 wherein the elemental titanium comprising layers consist essentially of elemental titanium.

9. The method of claim 1 wherein the chamber is a single wafer processor, and the elemental titanium and titanium silicide are respectively deposited in a single layer on each respective substrate between the first and second cleanings.

10. The method of claim 1 wherein the second plurality is greater in number than the first plurality.

11. The method of claim 1 wherein the second plurality is greater in number than the first plurality by a factor of at least 5.

12. The method of claim 1 wherein the second plurality is greater in number than the first plurality by a factor of at least 10.

13. The method of claim 1 wherein the first plurality is sufficient in number to reduce undesired surface particle count in a first in time deposited subset of the second plurality of substrates than would otherwise occur under identical processing conditions but without said chemical vapor depositing of elemental titanium on the first plurality of substrates.

14. The method of claim 1 further comprising providing the chamber at subatmospheric pressure after the first cleaning, the chamber not being exposed to room ambient pressure after being provided at the subatmospheric pressure until some time after depositing the titanium silicide layers on the second plurality of substrates.

15. The method of claim 1 wherein the first plurality is sufficient in number to reduce undesired surface particle count in a first in time deposited subset of the second plurality of substrates than would otherwise occur under identical processing conditions but without said chemical vapor depositing of elemental titanium on the first plurality of substrates; and further comprising providing the chamber at subatmospheric pressure after the first cleaning, the chamber not being exposed to room ambient pressure after being provided at the subatmospheric pressure until some time after depositing the titanium silicide layers on the second plurality of substrates.

16. The method of claim 1 wherein the plasma depositing of titanium silicide comprising layers occurs with plasma generation within the chamber.

17. The method of claim 1 wherein the plasma depositing of titanium silicide comprising layers occurs with plasma generation remote from the chamber.

* * * * *

UNITED STATES PATENT AND TRADEMARK OFFICE
CERTIFICATE OF CORRECTION

PATENT NO.   : 6,586,285 B1
DATED        : July 1, 2003
INVENTOR(S)  : Cem Basceri et al.

It is certified that error appears in the above-identified patent and that said Letters Patent is hereby corrected as shown below:

Column 2,
Line 25, replace "using $NH_4OH$ $H_2O_2$ and isopropyl alcohol in various" with
-- using $NH_4OH$, $H_2O_2$ and isopropyl alcohol in various --

Column 5,
Line 9, replace "depositing or titanium suicide layer depositing over such" with
-- depositing or titanium silicide layer depositing over such --
Line 45, replace "chamber using least $TiCl_4$ and a silane; and" with -- chamber using at least $TiCl_4$ and a silane; and --

Column 6,
Line 5, replace "The method of claim 1 where the first plurality from" with -- The method of claim 1 where the first plurality is from --

Signed and Sealed this

Sixteenth Day of March, 2004

JON W. DUDAS
*Acting Director of the United States Patent and Trademark Office*